United States Patent
Kang et al.

(10) Patent No.: US 11,462,523 B2
(45) Date of Patent: Oct. 4, 2022

(54) DISPLAY MODULE HAVING LED PACKAGES INCLUDING CONNECTION SUBSTRATE

(71) Applicant: SAMSUNG ELECTRONICS CO., LTD., Suwon-si (KR)

(72) Inventors: Jinhee Kang, Suwon-si (KR); Taesoon Park, Suwon-si (KR); Youngki Jung, Suwon-si (KR); Chulgyu Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/886,128

(22) Filed: May 28, 2020

(65) Prior Publication Data
US 2021/0028156 A1    Jan. 28, 2021

(30) Foreign Application Priority Data
Jul. 25, 2019 (KR) .......................... 10-2019-0090374

(51) Int. Cl.
*H01L 31/036* (2006.01)
*H01L 29/15* (2006.01)
(Continued)

(52) U.S. Cl.
CPC ........ *H01L 25/167* (2013.01); *H01L 25/0753* (2013.01); *H01L 33/62* (2013.01)

(58) Field of Classification Search
CPC ... H01L 25/167; H01L 25/0753; H01L 33/62; H01L 33/52; H01L 2933/0033;
(Continued)

(56) References Cited

U.S. PATENT DOCUMENTS 9,444,015 B2   9/2016   Bower et al.
9,853,002 B2   12/2017  Kariyazaki
(Continued)

FOREIGN PATENT DOCUMENTS

JP    5196262 B2    5/2013
JP    2019-15899 A  1/2019
(Continued)

OTHER PUBLICATIONS

Communication dated Feb. 4, 2022 by the European Patent Office in counterpart European Patent Application No. 20176932.0.
(Continued)

*Primary Examiner* — Ismail A Muse
(74) *Attorney, Agent, or Firm* — Sughrue Mion, PLLC

(57) ABSTRACT

A display module and a manufacturing method thereof is provided. The display module may include a substrate; a thin film transistor (TFT) layer disposed on a surface of the substrate; a plurality of LED packages including a connection substrate and a plurality of LEDs disposed on a first surface of the connection substrate; and a wiring configured to electrically connect the TFT layer and the plurality of LEDs. The wiring includes a first wiring for electrically coupling with the plurality of LEDs on the first surface, and a second wiring for electrically coupling with the TFT layer on a second surface of the connection substrate.

7 Claims, 17 Drawing Sheets

(51) Int. Cl.
   *H01L 29/04* (2006.01)
   *H01L 27/14* (2006.01)
   *H01L 25/16* (2006.01)
   *H01L 25/075* (2006.01)
   *H01L 33/62* (2010.01)

(58) Field of Classification Search
   CPC ............... H01L 23/49838; H01L 25/50; H01L 27/1214; H01L 33/36; H01L 33/54
   See application file for complete search history.

(56) References Cited

U.S. PATENT DOCUMENTS

| | | | |
|---|---|---|---|
| 9,935,153 | B1 | 4/2018 | Jung et al. |
| 2012/0181633 | A1* | 7/2012 | Miyata ................ H01L 21/3105 257/411 |
| 2015/0371585 | A1 | 12/2015 | Bower et al. |
| 2017/0250329 | A1* | 8/2017 | Takeya ................ H01L 27/153 |
| 2018/0076182 | A1 | 3/2018 | Wu et al. |
| 2018/0233494 | A1* | 8/2018 | Takeya ................ H01L 33/502 |
| 2018/0342691 | A1 | 11/2018 | Lu |
| 2019/0019928 | A1* | 1/2019 | Li ........................... H01L 33/62 |
| 2020/0286873 | A1 | 9/2020 | Schwarz et al. |

FOREIGN PATENT DOCUMENTS

| | | |
|---|---|---|
| JP | 2019-20924 A | 2/2019 |
| KR | 10-2017-0020485 A | 2/2017 |
| KR | 10-2017-0101065 A | 9/2017 |
| KR | 10-1899651 B1 | 9/2018 |
| KR | 10-2019-0006430 A | 1/2019 |
| KR | 10-1953797 B1 | 3/2019 |
| KR | 10-2019-0068112 A | 6/2019 |
| KR | 10-2019-0068113 A | 6/2019 |
| WO | 2015/193434 A2 | 12/2015 |
| WO | 2019/068523 A1 | 4/2019 |

OTHER PUBLICATIONS

International Search Report (PCT/ISA/210) dated Sep. 17, 2020 by the International Searching Authority in counterpart International Patent Application No. PCT/KR2020/006825.

Written Opinion (PCT/ISA/237) dated Sep. 17, 2020 by the International Searching Authority in counterpart International Patent Application No. PCT/KR2020/006825.

Communication dated Dec. 7, 2020 by the European Patent Office in counterpart European Patent Application No. 20176932.0.

* cited by examiner

DISPLAY MODULE HAVING LED PACKAGES INCLUDING CONNECTION SUBSTRATE

CROSS-REFERENCE TO RELATED APPLICATION

This application is based on and claims priority under 35 U.S.C. § 119 to Korean Patent Application No. 10-2019-0090374, filed on Jul. 25, 2019, in the Korean Intellectual Property Office, the disclosure of which is incorporated by reference herein in its entirety.

BACKGROUND

1. Field

The disclosure relates to the field of display manufacture, and more particularly, to a display module with a plurality of LED packages transferred to a target substrate from a micro transfer substrate and a manufacturing method thereof.

2. Description of Related Art

A light emitting diode (LED) is a micro inorganic light emitting material that self-emits light without a color filter and back light. The LED may be divided into a lamp type (lead wire type) and a chip type (surface mounted device (SMD) type).

The chip type LED may be grown on a wafer by an epitaxy process (through crystal growth or material deposition on a substrate). The LED manufactured in this manner may be transferred to a target substrate, which may constitute a display module.

SUMMARY

An object of the disclosure is to provide a micro LED transfer method for transferring an light emitting diode (LED) package including a plurality of LEDs mounted on a connection substrate, which is formed with wiring layer on the top surface and the bottom surface, from a transfer substrate to a target substrate, and a display module manufactured by the method thereof.

According to an embodiment, there is provided a display module including: a substrate; a thin film transistor (TFT) layer disposed on a surface of the substrate; a plurality of LED packages comprising a connection substrate and a plurality of LEDs disposed on a first surface of the connection substrate; and a wiring configured to electrically connect the TFT layer and the plurality of LEDs. The wiring comprises a first wiring for electrically coupling with the plurality of LEDs on the first surface, and a second wiring for electrically coupling with the TFT layer on a second surface of the connection substrate.

An electrode of each of the plurality of LEDs is electrically coupled with the first wiring through a first electrode pad formed on the first surface of the connection substrate, and an electrode on the TFT layer is electrically coupled with the second wiring through a second electrode pad formed on the second surface of the connection substrate.

Each of the plurality of LED packages is electrically coupled to a common electrode or individual electrodes formed on the TFT layer.

The first wiring and the second wiring are electrically coupled to each other through at least one via hole.

The connection substrate may further include at least one wiring layer.

The display module further includes a molding part formed on the connection substrate to cover the plurality of LED packages.

The molding part covers the TFT layer exposed between the plurality of LED packages.

Each of the plurality of LED packages constitutes at least one display pixel.

According to an embodiment, there is provided a manufacturing method of a display module, the method including: separating a connection substrate formed with a wiring layer at a predetermined size; transferring a plurality of LEDs onto the separated connection substrate; and transferring a LED package comprising the separated connection substrate and the plurality of LEDs mounted on the separated connection substrate to a TFT layer formed on a target substrate.

The manufacturing method further includes forming the LED package by mounting the plurality of LEDs to the connection substrate after the connection substrates is transferred onto a carrier substrate.

The manufacturing method further includes, prior to the transferring of the LED package, transferring the LED package from the carrier substrate to a transfer substrate.

The transferring the LED package to the TFT layer formed on the target substrate further includes: picking the LED package from the carrier substrate by a picker; moving the picker to a predetermined position; and depositing the LED package to a position corresponding to the predetermined position on the TFT layer of the target substrate.

The manufacturing method further includes: prior to the transferring of the LED package to the TFT layer of the target substrate, transferring the LED package from the carrier substrate to an additional carrier substrate configured to face the carrier substrate; and laser transferring the LED package to the TFT layer of the target substrate from the additional carrier substrate.

The manufacturing method further includes forming a black matrix between a plurality of LED packages disposed at a predetermined pitch to the TFT layer of the target substrate.

The manufacturing method further includes covering the plurality of LED packages and the black matrix with a transparent protection layer.

The manufacturing method further includes forming a molding part on the connection substrate to cover the plurality of LED packages.

The forming the molding part includes covering the TFT layer exposed between the each of the plurality of LED packages.

According to an embodiment, there is provided a non-transitory computer readable recording medium including a program that includes at least one instruction, when executed by a processor, causes a computer to perform a manufacturing method of a display module, the manufacturing method including: separating a connection substrate formed with a wiring layer at a predetermined size; transferring a plurality of LEDs onto the separated connection substrate; and transferring a LED package comprising the separated connection substrate and a plurality of LEDs mounted on the separated connection substrate to a TFT layer formed on a target substrate.

The plurality of LEDs are micro LEDs.

The display module further includes a plurality of black matrices disposed between the plurality of LED packages.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
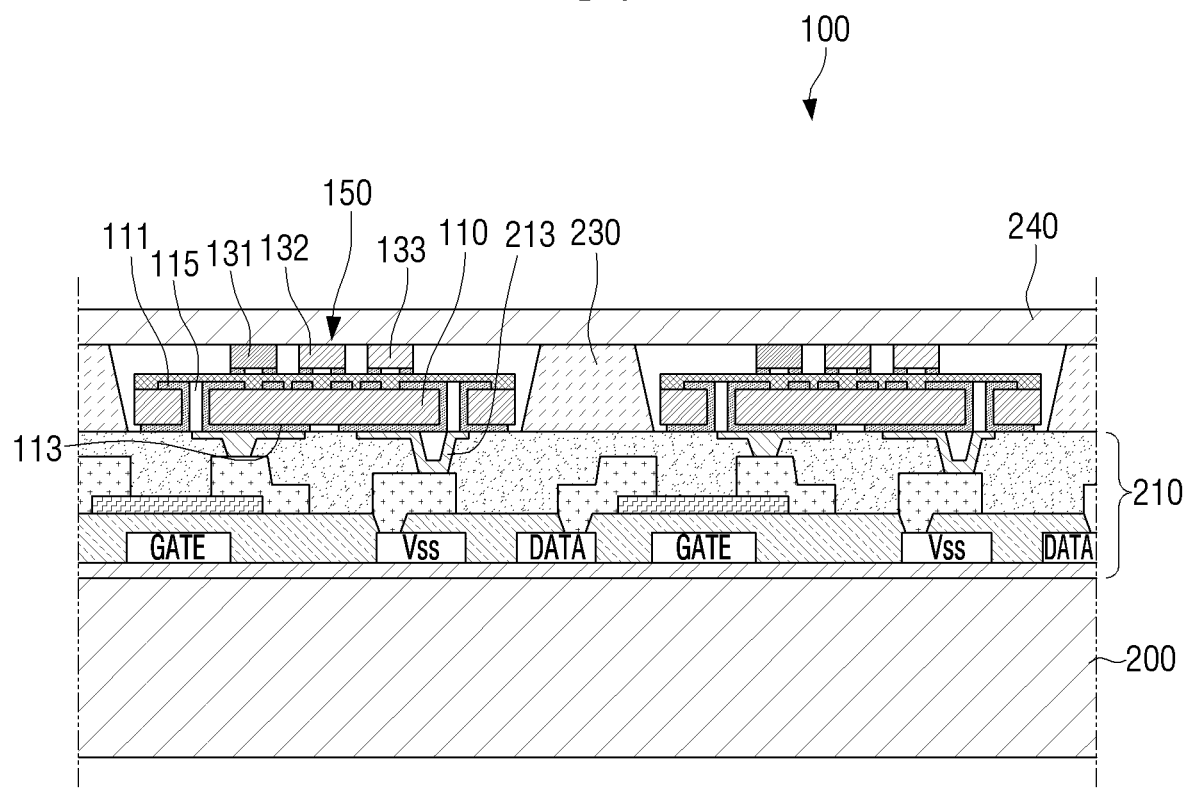
FIG. 1 is a schematic diagram illustrating a cross-sectional view of a display module including an LED package according to an embodiment.

Embodiments of the disclosure will be described with reference to the accompanying drawings, such that one of ordinary skill in the art would reasonably understand the embodiments of the disclosure described herein. However, the disclosure is not limited to the embodiments described herein. The disclosure may be realized in various forms, and various changes and modifications may be made the embodiments described herein. Rather, the description of the embodiments are provided to more fully explain the scope of the disclosure to those skilled in the art. For the convenience of description, the elements in the accompanying drawings are enlarged so that they are larger than their actual sizes, and the ratio of each element are exaggerated or reduced to more clearly describe the embodiments of the disclosure.

It will be understood that when an element is referred to as being "on" or "connected to" or "coupled to" another element, it can be directly on or connected or coupled to the other element or an intervening element may be present. When an element is referred to as being "directly on" or "directly connected" or "directly coupled" to another element, there may be no intervening elements therebetween.

The terms such as "first," "second," and so on may be used to describe a variety of elements, but the elements should not be limited by these terms. The terms may be used only to distinguish one element from another. For example, a first element may be designated as a second element, and likewise, a second element may also be designated as a first element.

A singular expression may include a plural expression, unless otherwise indicated. It is to be understood that the terms such as "comprise" or "consist of" are used herein to designate a presence of a characteristic, number, step, operation, element, component, or a combination thereof, and may be interpreted as adding one or more of other characteristics, numbers, steps, operations, elements, components or a combination thereof.

The display module manufactured according to the embodiments of the disclosure may include a thin film transistor (TFT) layer on a surface of a substrate, a plurality of light emitting diode (LED) packages electrically coupled to the TFT layer, and a wiring electrically coupling circuits disposed to a back surface of the substrate. The substrate may be any one of a transparent substrate (e.g., glass substrate, quartz substrate, etc.), a flexible substrate and a plastic substrate, and may be referred to as a backplane. In addition, the substrate including the TFT layer may be referred to as a 'TFT substrate,' a 'TFT backplane,' or a 'target substrate,' and the terms may be used interchangeably in the disclosure.

The LED package may refer to a structure including a connection substrate which is a portion of the transfer substrate and a plurality of LEDs disposed in an electrically coupled state on the connection substrate. In this case, the display module according to an embodiment may be formed with a molding part for covering all of the plurality of LED packages after transferring the plurality of LED packages to the target substrate.

The display module may include a separate substrate (for example, the separate substrate may be disposed at a rear of the target substrate considering the disposition; hereinafter "rear substrate") that electrically couples to a back surface of the target substrate through a flexible printed circuit (FPC). The rear substrate may be formed in a thin film form, in which a thickness of the thin film arranging at about tens of μm (e.g., 50 μm or less) or in a thin glass form. When the rear substrate is formed in a thin film form, the plastic material may be formed in any one or a combination of materials including, for example, polyimide (PI), polyethylene terephthalate (PET), polyethersulfone (PES), polyethylene naphthalate (PEN) and polycarbonate (PC).

The target substrate may be formed with a side surface wiring formed at an edge part, and may electrically connect a first connection pad formed at the edge part of a front surface and a second connection pad formed at the back surface of the target substrate. The side surface wiring may be formed along a front surface, a side end surface, and the back surface of the target substrate, and one end of the side surface wiring may be electrically coupled to the first connection pad and an opposite end may be electrically coupled to the second connection pad. The side surface wiring may protrude from the side end surface of the target substrate by the thickness of the side surface wiring because a portion thereof may be formed on the side end surface of the target substrate. In this case, the rear substrate may be electrically coupled to the second connection pad through the FPC. The driver integrated circuit (IC) mounted to the back surface of the target substrate may be directly connected with the second connection pad or indirectly connected through a separate wiring.

The display module described above may be arranged in plurality as a tiled type to form a large-scale display apparatus. In other words, a plurality of display modules may be arranged so that the plurality of display modules form a large-scale display apparatus.

As an example of a flat panel display, the display module may be arranged with a plurality of micro light emitting diodes (also referred to as microLED or μLED) which are respectively 100 μm or less, and the micro light emitting diode may be an a plurality of inorganic light emitting diodes (inorganic LED). The display module according to the embodiments herein may improve contrast ratio, response time and energy efficiency compared to liquid crystal display (LCD) panels requiring back light.

The micro LED is advantageous for its fast response rate, low power consumption, high brightness, long lifespan and others, and is regarded as the light emitting device of next generation in displays. Specifically, the micro LED exhibits a greater efficiency in converting electricity to photons compared to a conventional liquid crystal display (LCD) or an organic light emitting diode (OLED). That is, the "brightness per watt" is greater compared to conventional LCDs or OLED display. Accordingly, the micro LED may emit light at a similar brightness with about half of the energy consumed to emit light in conventional LEDs or OLEDs. In addition, the micro LED may be smaller in size than those conventional LEDS, which may exceed 100 μm in width, length and height. Additionally, the micro LED may exhibit a higher resolution, a superior color, contrast and brightness, a wider color range, and exhibit sharpness even under bright sunlight. The micro LED may be guaranteed a long lifespan without deformation due to its insusceptibility to a burn in phenomenon and its characteristic of generating less heat.

The micro LED may be formed with anode and cathode electrodes on a same first surface and a light emitting surface and may be formed with a flip chip structure on a second surface positioned at an opposite side of the first surface formed with the electrodes.

The LED package may include at least two micro LEDs emitting different colors from each other and a middle substrate mounted with the micro LEDs cut to a predetermined size (hereinafter, referred to as "connection substrate").

The LED package may be formed with a wiring at each of the one surface of the connection substrate and the opposite surface positioned at the opposite side of the one surface of the connection substrate. The micro LEDs may be electrically coupled to the one surface of the connection substrate, and the opposite surface may be electrically coupled to the target substrate. The connection substrate may be formed as multi-layers, the size (i.e., length and width) of the formed electrode pad may be without limitation, and the connection substrate may be coupled to various forms according to the configuration of the TFT substrate.

The connection substrate forming the LED package may not be mounted with a separate electronic device other than the micro LED, and may perform a passage role of electrically coupling each micro LED and a target substrate interchangeably.

The connection substrate may be formed with at least one via hole. As such, each of the micro LEDs disposed at the one surface of the connection substrate may be electrically coupled to individual electrode pads or a common electrode pad formed at the opposite surface of the connection substrate through the via hole.

The connection substrate may also be formed with the side surface wiring for electrically coupling wirings formed at each of the one surface and the opposite surface of the connection substrate at the edge part. In this case, the connection substrate may include both the via hole and the side surface wiring.

The connection substrate may be formed of insulators such as polyimide (PI) substrate, glass substrate or silicon wafer.

The LED package may be conveyed and arranged to an appropriate position of a transfer substrate when performing a shuffling process taking into consideration the arrangement for improving image quality and uniformity.

The LED package may, based on a plurality of micro LEDs being electrically connected to the connection substrate, perform an electro luminescence (EL) test on the LED package. As such, a defective LED package may be easily detected through the EL test (e.g., detecting whether the plurality of micro LEDs mounted on each LED package is defective or below the standard). A zero-defect display module may be realized by removing all the detected defective LED packages from the transfer substrate and replacing with normal LED packages to the empty positions from which the detected defective LED packages were removed.

The LED package may be transferred from the transfer substrate to a target substrate through a pick and place method, a stamping method, or a laser transfer method. However, the method of transfer is not limited thereto.

The display module may be installed and applied to a wearable device, a portable device, a handheld device and various electronic products or electronic devices that require a display as a single unit, and may be applied to a display device such as a monitor for a personal computer (PC), a high resolution TV and signage through a plurality of assembly arrangements in matrix type.

The display module including a plurality of LED packages according to an embodiment will be described below with reference to FIG. 1.

FIG. 1 is a schematic diagram illustrating a cross-sectional view of a display module including an LED package according to an embodiment.

The display module 100 may include a transparent substrate 200, a TFT layer 210 formed at one surface of the transparent substrate 200, and a plurality of LED packages 150 arranged to be electrically coupled to the TFT layer 210. The structure that includes both the transparent substrate 200 and the TFT layer 210 may be referred to as a 'TFT substrate,' a 'TFT back plane,' or a 'target substrate.' In the embodiments described herein, this structure is referred to as a 'target substrate.'

The plurality of LED packages 150 may be arranged at a predetermined pitch on the TFT layer 210. The display module 100 may further include a black matrix 230 formed between each of the plurality of LED packages 150. The display module 100 may include a protection layer 240 covering the plurality of LED packages 150 and the black matrix 230. The protection layer may be formed of a transparent material.

The plurality of LED packages 150 may form a display pixel. The plurality of LED packages 150 may include at least two or more micro LEDs 131,132 and 133 emitting light of different colors from one another, and a connection substrate 110 electrically coupling the micro LEDs 131,132 and 133 and the TFT layer 210. Each of the micro LEDs 131,132 and 133 may be a sub pixel forming one display pixel.

Figure 8:
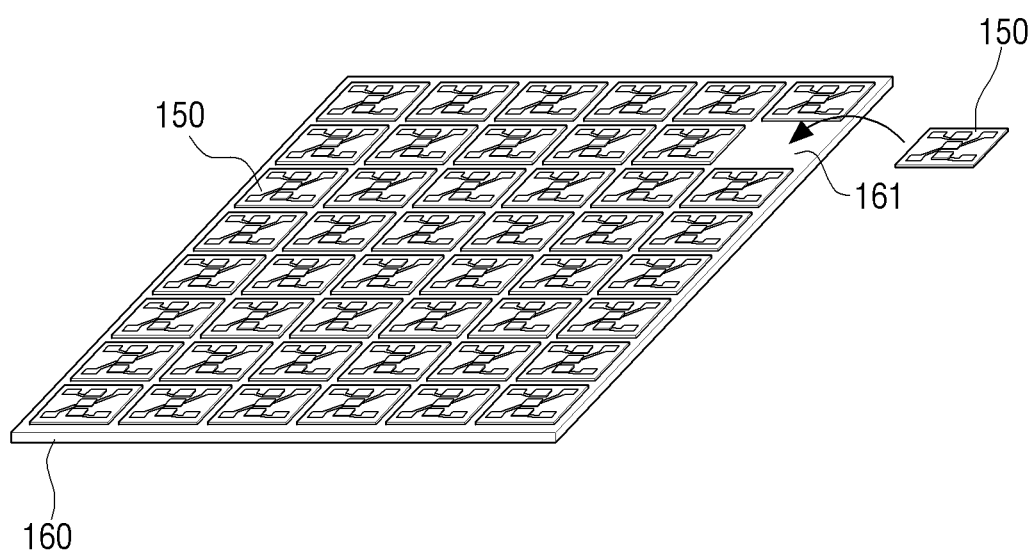
FIG. 8 is a diagram illustrating a manufacturing process of transferring an LED package from a carrier substrate to a transfer substrate according to an embodiment.

The connection substrate 110 may be a part of a transfer substrate 160 (shown in FIG. 8). Specifically, the plurality of micro LEDs epi grown on the epi substrate may be conveyed to the transfer substrate at a predetermined pitch. Here, the predetermined pitch may be different from the above-described predetermined pitch in which the plurality of LED packages 150 are arranged on the TFT layer 210.

The plurality of micro LEDs conveyed to the transfer substrate may be arranged in a predetermined pattern. The pattern may use a predetermined number of micro LEDs as sub pixels to form a single display pixel.

Accordingly, when the transfer substrate arranged with the plurality of micro LEDs are cut to a size corresponding to approximately a single display pixel, the LED package 150 including the connection substrate 110 with the plurality of micro LEDs 131,132 and 133 that form a signal display pixel and the micro LEDs electrically coupled to the connection substrate 110 may be manufactured.

The connection substrate 110 may be formed with a first wiring 111 electrically connected to the plurality of micro LEDs 131,132 and 133 on the one surface of the connection substrate 110. The connection substrate 110 may also be formed with a second wiring 113 electrically connected to the TFT layer 210 on the opposite surface of the connection substrate 110 (a surface opposite from the one surface).

Figure 6:
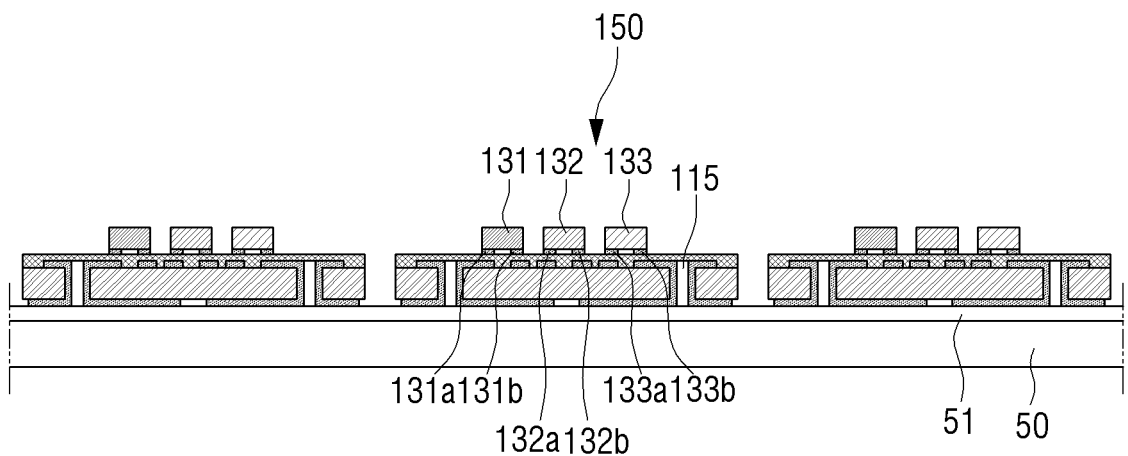
FIG. 6 is a diagram illustrating a manufacturing process of a display module including an LED package grown from a growth substrate according to an embodiment.

The first wiring 111 may be formed with a plurality of first electrode pads that connect with each anode and cathode electrodes 131*a*,131*b*,132*a*,132*b*,133*a* and 133*b* (as shown in FIG. 6) of the plurality of micro LEDs 131,132 and 133. The second wiring 113 may also be formed with the plurality of first electrode pads that are electrically coupled with the electrode pads of the TFT layer 210.

In addition, the connection substrate 110 may include at least one via hole 115, and the via hole may be configured with a conductor to electrically couple the first wiring 111 and the second wiring 113.

In addition, the connection substrate 110 may be formed with a side surface wiring at the edge part of the connection substrate 110 to also electrically couple the first and second wirings 111 and 113 to each other. The side surface wiring may be formed after depositing a conductive material to the edge part of the connection substrate 110 and the conductive material may be removed with a laser beam leaving a portion of the conductive material to be used as side surface wiring. In addition, the side surface wiring may be formed by printing the conductive material to the wiring at a predetermined width.

The plurality of micro LEDs 131,132 and 133, which are sub-pixels mounted on the one connection substrate 110, have been described as forming a single display pixel, but the embodiment is not limited thereto. The plurality of micro LEDs 131, 132 and 133 may form two or more display pixels and may be disposed on one connection substrate 110.

Figure 2A:
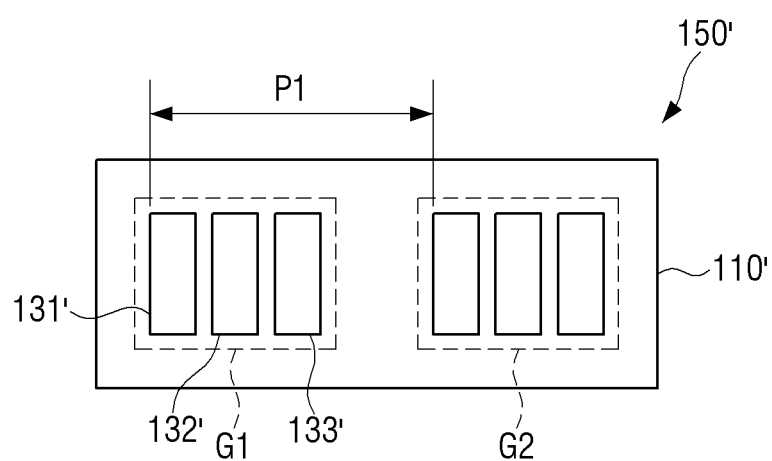
FIG. 2A is a diagram illustrating an LED package according to an embodiment.

FIG. 2A is a diagram illustrating an LED package according to an embodiment. According to an embodiment, the LED package 150' may be provided with two display pixels G1 and G2 (i.e., each pixel formed with three micro LEDs 131', 132' and 133') on one connection substrate 110'. Here, each display pixel G1 and G2 may be arranged to be spaced apart at a display pitch P1. The connection substrate 110' of the LED package 150' illustrated in FIG. 2A may, for example, be formed so that the length of the connection substrate is longer than the width of the connection substrate. However, the embodiment is not limited thereto. The connection substrate 110' of the LED package 150' may be formed such that the length and the width are equal to each other.

The plurality of micro LEDs 131', 132' and 133', each of which are sub-pixels, may be operated on the connection substrate 110' with a passive matrix (PM) driving method.

The plurality of LED packages 150' may be operated on the target substrate with an active matrix (AM) driving method. The PM driving method is a method for applying voltage consecutively to electrodes that are crossed in horizontal direction and vertical direction. The AM driving method is a method for directly driving each pixel individually when each pixel includes a TFT and an electrode, in which the TFT performs a switch role for each pixel and a capacitor that stores information for a predetermined time (e.g., one frame).

Figure 2B:
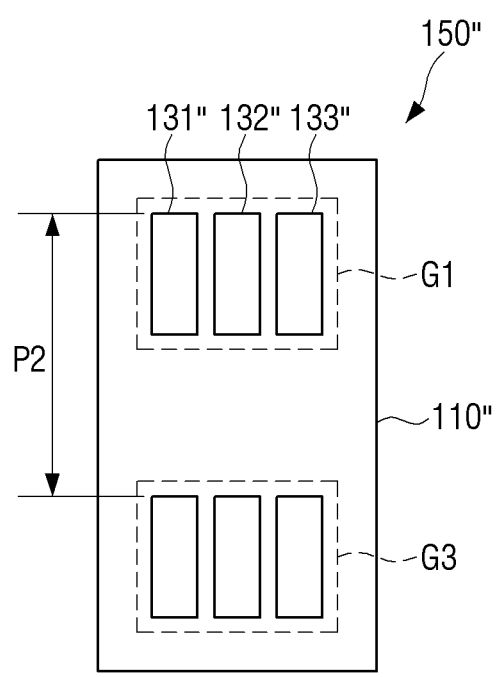
FIG. 2B is a diagram illustrating an LED package according to an embodiment.

FIG. 2B is a diagram illustrating an LED package according to another embodiment. Referring to FIG. 2B, the LED package 150" may be provided with two display pixels G1 and G3 (i.e., each pixel formed with three micro LEDs 131", 132" and 133") on one connection substrate 110". This is similar to the LED package 150' shown in FIG. 2A. Here, each display pixel G1 and G3 may be arranged to be spaced apart at a display pitch P2. In contrast to the LED package 150', the LED package 150" may be formed so that the width of the connection substrate 110" is longer than the length of the connection substrate 110".

Figure 2C:
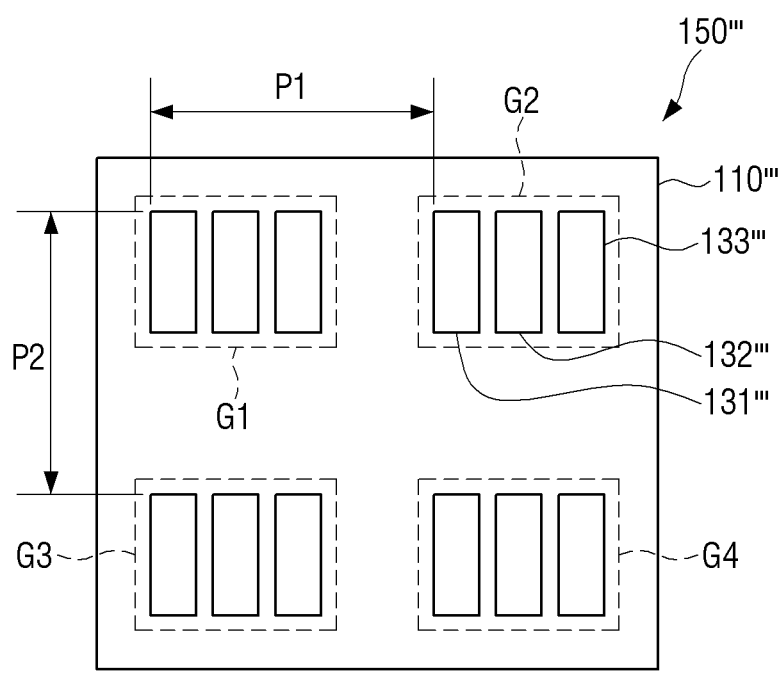
FIG. 2C is a diagram illustrating an LED package according to an embodiment.

FIG. 2C is a diagram illustrating an LED package according to yet another embodiment. Referring to FIG. 2C, the LED package 150''' may be provided with four display pixels G1, G2, G3 and G4 (i.e., each pixel formed with three micro LEDs 131''', 132''' and 133''') on one connection substrate 110'''. Here, each pixel may be arranged to be spaced apart at predetermined display pitches P1 and P2 in a horizontal direction and a vertical direction, respectively.

In the embodiments illustrated in FIGS. 2B and 2C, the plurality of micro LEDs which are sub-pixels may be operated on the connection substrate with the PM driving method, and the plurality of LED packages may be operated on the target substrate with the AM driving method.

In addition, the LED package according to still another embodiment may be configured so that an odd number of display pixels are arranged on one connection substrate.

In addition, the number of micro LEDs that form a signal display pixel may be formed of a micro LED emitting at least two different colors. For example, a signal display pixel may be formed by combining micro LEDs of various colors of red/blue, red/green, green/blue, red/blue/green, red/blue/white, red/green/blue/white, red/green/green/white, or the like. However, the combination of micro LEDs of various colors is not limited thereto.

Figure 3:
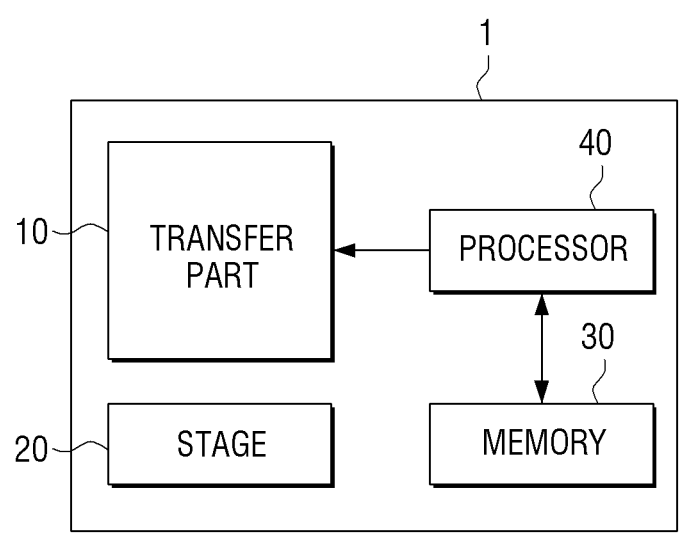
FIG. 3 is a schematic block diagram illustrating an LED package transfer device according to an embodiment.

FIG. 3 is a block diagram illustrating an LED package transfer device according to an embodiment.

Figure 9:
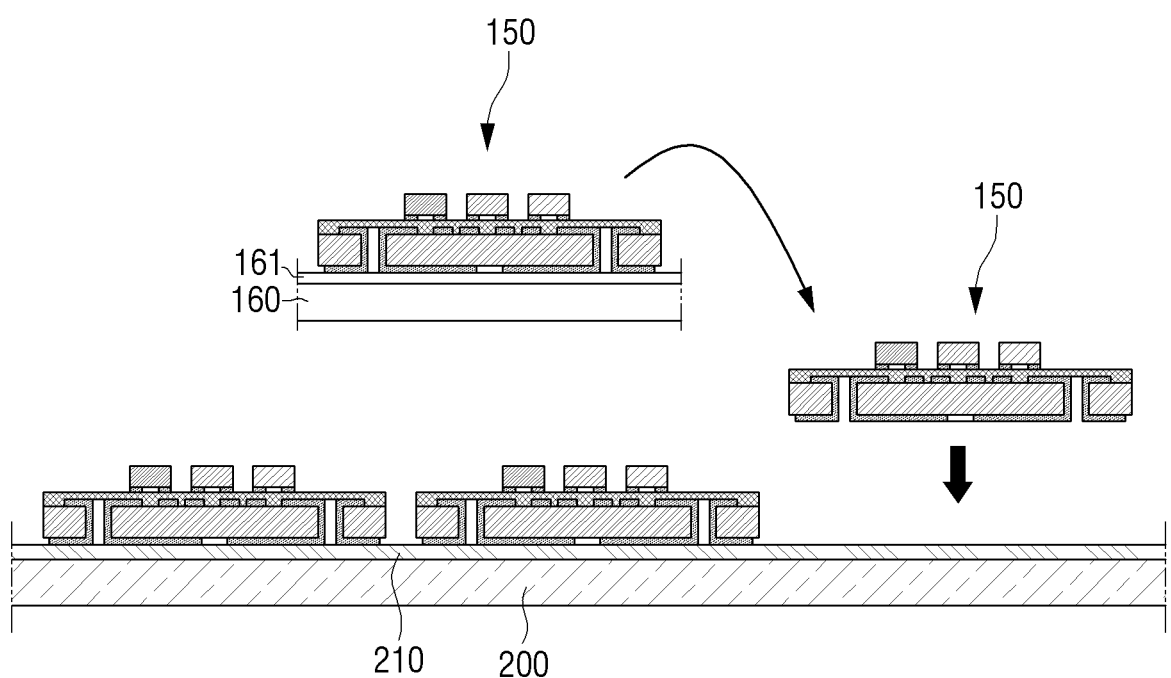
FIG. 9 is a diagram illustrating a manufacturing process of transferring an LED package from a transfer substrate to a target substrate according to an embodiment.

Referring to FIG. 3, the LED package transfer device 1 may include a transfer part 10 for transferring the plurality of LED packages 150 disposed at a predetermined arrangement on the transfer substrate 160 (shown in FIG. 8) to the target substrate 200 (shown in FIG. 9). The LED package transfer device 1 may also include a stage 20 disposed adjacent to the transfer part 10 and configured to move the target substrate along the X-axis, Y-axis, Z-axis. The LED package transfer device 1 may include a memory 30 configured to store characteristic information of each of the plurality of LED packages and a processor 40 configured to identify a position where each of the plurality of LED packages are to be disposed on the transfer substrate based on the stored characteristic information, and control the transfer part 10 and the stage 20 to transfer the plurality of LED packages to the identified positions.

The transfer part 10 may simultaneously transfer the predetermined LED packages from the transfer substrate to the target substrate 200 through a laser lift off (LLO) method.

The transfer part 10 may, in order to proceed with the transfer process through the LLO method, include a laser oscillator 300 (shown in FIG. 13) for irradiating a laser beam toward the transfer substrate, and a stage capable of moving the transfer substrate along the X-axis, the Y-axis, and the Z-axis and rotating about a Z-axis.

The stage 20 may clamp the target substrate 200 to the top surface of the stage 20 such that the target substrate 200 is detachable, and may move the target substrate 200 in a clamped state along the X-axis, the Y-axis, and the Z-axis and rotate about the Z-axis.

The memory 30 may be implemented as at least one of a flash memory type, a read only memory (ROM), a random access memory (RAM), a hard disk type, a multimedia card micro type, or a card type memory (e.g., a secure digital (SD) memory, an extreme digital (XD) memory, etc.).

In addition, the memory 30 may be electrically coupled with the processor 40 to transfer signals and information with the processor 40. The memory 30 may store characteristic information of input or irradiated plurality of LED packages, and the processor 40 may access characteristic information stored in the memory 30.

The processor 40 may control the overall operations of the LED package transfer device 1. That is, the processor 40 may be electrically coupled with the transfer part 10 and the stage 20 and may control each component.

For example, the processor 40 may control the transfer part 10 and the stage 20 to convey the plurality of LED packages to a carrier substrate 50 (referring to FIG. 4), and convey again from the carrier substrate 50 to the transfer substrate.

When conveying the plurality of LED packages 150 from the carrier substrate 50 to the transfer substrate, the characteristic information of the plurality of LED packages may be used to arrange for a relatively uniform characteristic to be provided throughout the whole area of the transfer substrate.

That is, the processor 40 may test the characteristics on the plurality of LED packages arranged on the carrier substrate, and analyze the brightness, wavelength, and the like of each micro LED included in the LED package per each area of the carrier substrate. The analyzed result may be stored in the memory 30.

When characteristic testing is completed, the processor 40 may perform simulations based on the position and combination of each LED package to analyze the brightness and wavelength of the display module 100 and to test the overall uniformity prior to transferring from the carrier substrate to the transfer substrate.

When an optimum arrangement of the plurality of LED packages to be disposed on the transfer substrate through the simulation is determined, the processor 40 may be further configured to form a data map based the determined optimum arrangement. The data map may be stored in the memory 30.

Based on the data map, the plurality of LED packages on the carrier substrate may be conveyed to the transfer substrate through the pick and place method, the stamping method or the LLO method.

The processor 40 may control the transfer part 10 and the stage 20 to convey the plurality of LED packages arranged on the transfer substrate 150 to the target substrate 200. However, the embodiment is not limited to controlling each and every component of the LED package transfer device 1 by a single processor 40, but may be controlled by multiple processors. In addition, the processor 40 may include one or more of a central processing unit (CPU), a controller, an application processor (AP), a communication processor (CP), and an ARM processor.

The LED package transfer process according to an embodiment will be described sequentially with reference to FIGS. 4 to 10B below.

Figure 4:
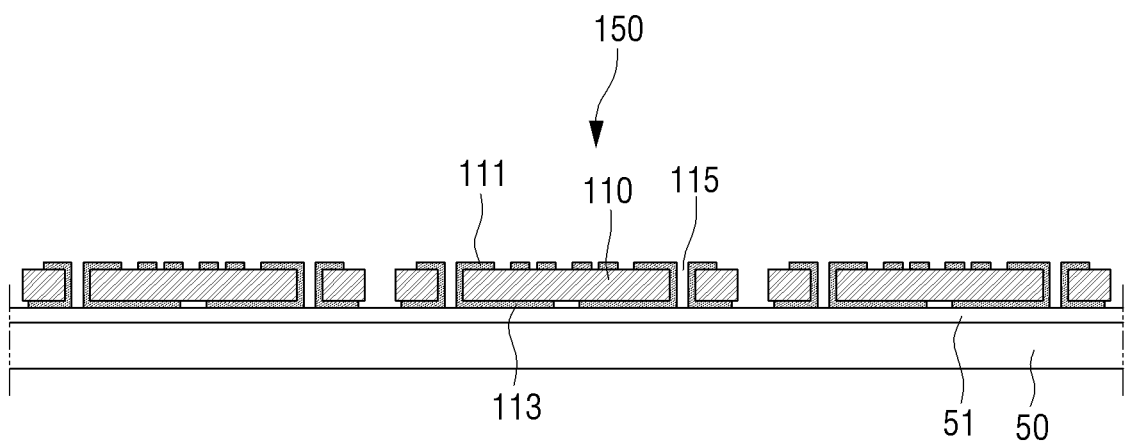
FIG. 4 is a diagram illustrating LED packages on a carrier substrate according to an embodiment.

FIG. 4 is a diagram illustrating LED packages on a carrier substrate according to an embodiment. Referring to FIG. 4, the plurality of connection substrates 110 may be arranged on the carrier substrate 50 at a predetermined distance. In this case, the plurality of connection substrates 110 may be arranged in a matrix form.

The connection substrate 110 may be formed with first and second wirings 111 and 113 to each of the one surface and the opposite surface. In this case, the first and second wirings 111 and 113 may be electrically coupled through the via hole 115.

On the one surface of the connection substrate 110, a plurality of first electrodes (shown in FIG. 6) capable of being electrically coupled to each of the plurality of micro LEDs may be formed. Here, the plurality of first electrode may be electrically coupled with the first wiring 111. In addition, on the opposite surface of the connection substrate 110, a plurality of second electrodes capable of being electrically coupled to the TFT layer 210 (referring to FIG. 1) may be formed. Here, the plurality of second electrodes may be electrically coupled with the second wiring 113.

The carrier substrate 150 may be formed as a transparent substrate with material, such as quartz. On one surface of the carrier substrate 50, the plurality of connection substrates 110 and an adhesive layer 51 to which the plurality of connection substrates 110 are attached may be formed. Here, the plurality of connection substrates 110 may be detachably configured on the adhesive layer 51. For example, the adhesive layer 51 may be a pressure sensitive adhesives (PSA).

Figure 5:
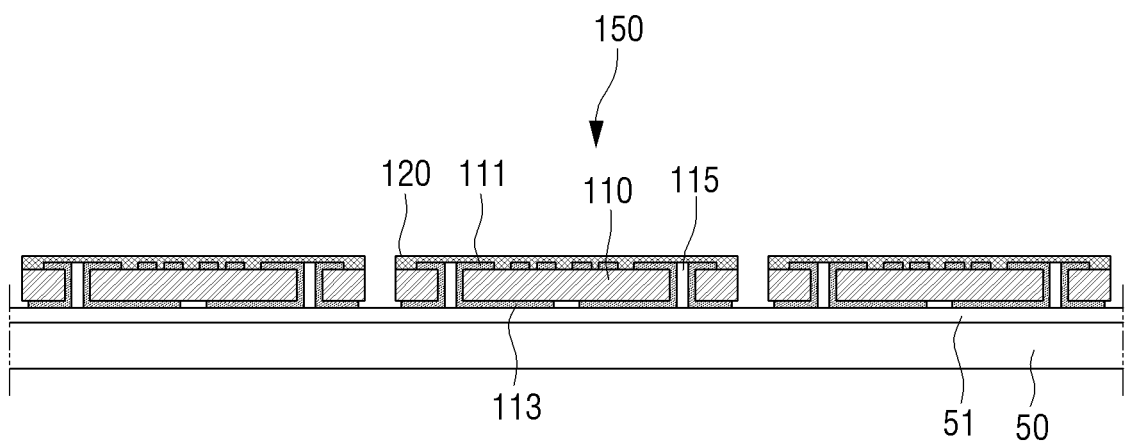
FIG. 5 is a diagram illustrating a manufacturing process of a display module including a conductive film according to an embodiment.

Referring to FIG. 5, an anisotropic conductive film 120 may be laminated to the one surface of the plurality of connection substrates 110 arranged on the carrier substrate 50 so that the plurality of micro LEDs may be attachable in an electrically coupled state to the one surface of the connection substrate 110.

Referring to FIG. 6, the plurality of micro LEDs 131,132 and 133 grown from a growth substrate may be seated on the anisotropic conductive film 120 on the connection substrate after undergoing an isolation process.

The plurality of micro LEDs 131,132 and 133 may be formed in a flip chip form, and each of the anode and cathode electrodes 131*a*, 131*b*, 132*a*, 132*b*, 133*a* and 133*b* may be electrically coupled to each of the plurality of first electrodes formed at each connection substrate 110.

In this case, the plurality of micro LEDs 131,132 and 133 may be a micro LED emitting red (R), green (G) and blue (B) colors respectively, and three micro LEDs 131,132 and 133 may be sub-pixels forming at display pixel.

However, an example of the red, green and blue micro LEDs 131,132 and 133 forming one display pixel is provided, the embodiment is not limited thereto, and a display pixel may include two or more micro LEDs emitting at least two different colors. For example, a signal display pixel may be formed by combing micro LEDs of various colors of red/blue, red/green, green/blue, red/blue/green, red/blue/white, red/green/blue/white, red/green/green/white, or the like.

Figure 7:
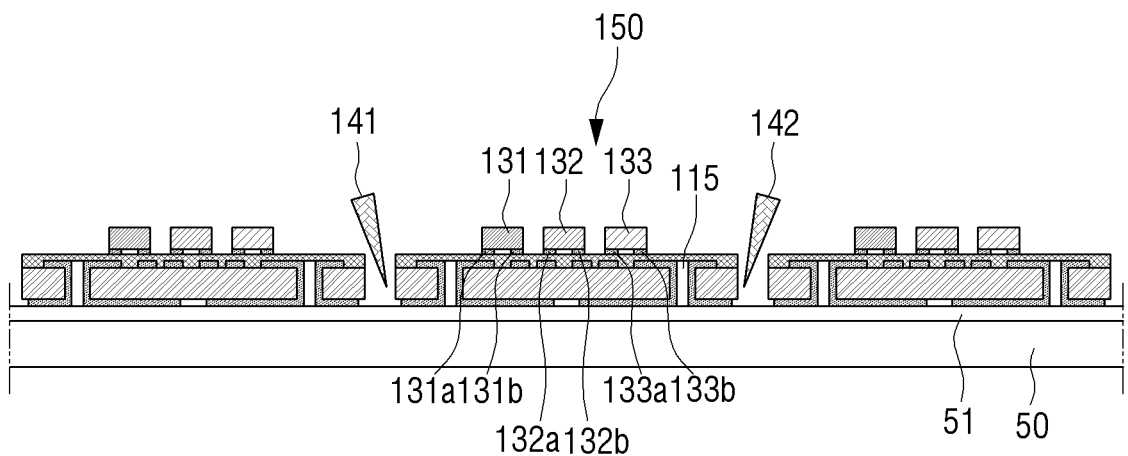
FIG. 7 is a diagram illustrating a manufacturing process of performing an electro luminescence test according to an embodiment.

Referring to FIG. 7, after disposing all of the plurality of micro LEDS 131, 132 and 133 to each connection substrate 110 on the carrier substrate 50, the EL test on the plurality of micro LEDS 131, 132 and 133 may be performed.

The EL test is a non-destructive inspection method that uses a probe, and may identify the operation characteristics of the micro LED by measuring the electro luminescence characteristics disposed on the carrier substrate.

After the EL testing as described above, an LED package including a micro LED that indicates a characteristic lower than a predetermined threshold, or a defective micro LED that does not emit light may be determined through a screening process.

The LED packages that pass the screening process may then be precisely divided by correlated color temperature (CCT) or by light-emitting colors undergoing a color binning process.

The test result data obtained by undergoing the EL test, the screening process, and the color binning process may be stored in the memory 30 of the LED package transfer device 1.

The processor 40 may be configured to generate a shuffle data for the plurality of LED packages 150 conveyed from the carrier substrate 50 to the transfer substrate 160 to be arranged to have a certain overall uniform brightness on the transfer substrate 160 based on the test result data.

Referring to FIG. 8, the plurality of LED packages 150 on the carrier substrate 50 may be conveyed to the transfer substrate 160. In this case, the plurality of LED packages 150 may be arranged to have a certain overall uniform brightness on the transfer substrate 160 based on the above-described shuffle data.

The transfer substrate 160 may be a glass substrate or a silicon wafer. The transfer substrate 160 may be formed with the adhesive layer 161 on at the one surface to which the plurality of LED packages 150 may be attached in an easily separable manner from the transfer substrate 160. In this case, the adhesive layer 161 may be the pressure sensitive adhesives (PSA).

The plurality of LED packages 150 conveyed to the transfer substrate 160 may be exposed with a plurality of micro LEDs and the opposite surface of the connection substrate may be attached to the transfer substrate.

Referring to FIG. 9, the plurality of LED packages 150 disposed on the transfer substrate 160 may be transferred to the target substrate 200. Here, because the plurality of micro LEDs 131, 132 and 133 are in an exposed state, the plurality of LED packages 150 may be transferred from the transfer substrate 160 to the target substrate 200 through the pick and place transfer process or the stamping transfer process.

By transferring the plurality of LED packages 150 to a predetermined position of the target substrate 200, a basic structure of the display module 100 may be formed.

Figure 10A:
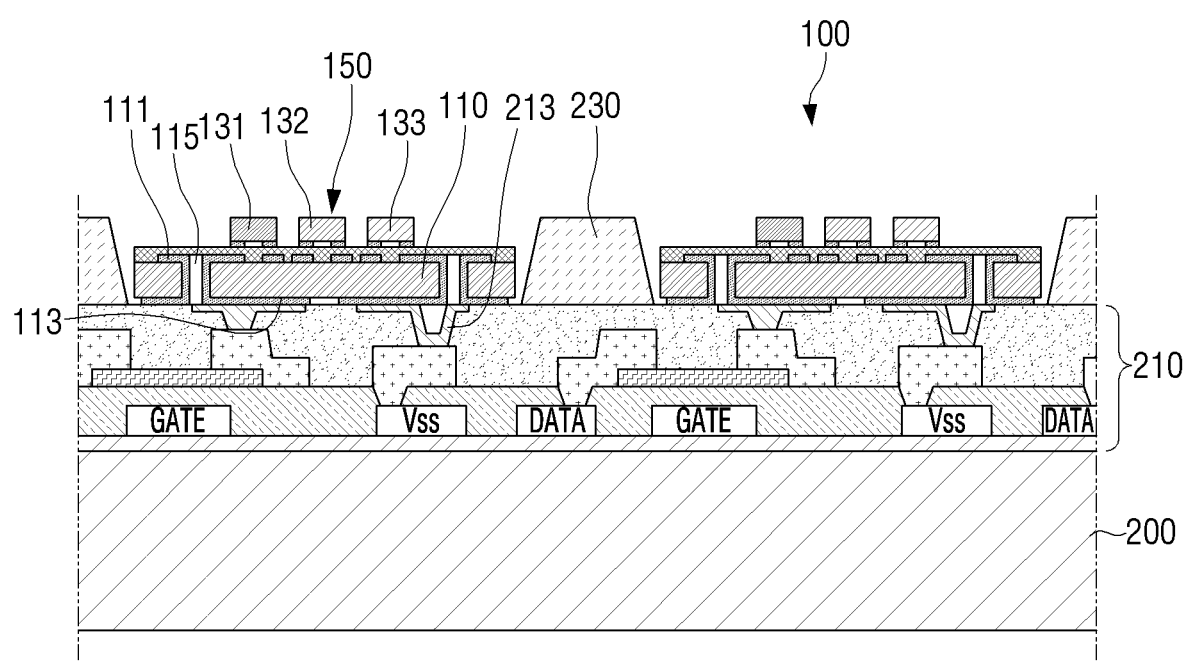
FIG. 10A is a diagram illustrating a manufacturing process of a display module including a black matrix between each of LED packages according to an embodiment.

Referring to FIG. 10A, according to an embodiment, the display module 100 may form a black matrix 230 between each of the plurality of LED packages 150 on the TFT layer 210. The black matrix 230 blocks light leakage from a peripheral area of each LED package adjacent to one another to improve contrast ratio.

Figure 10B:
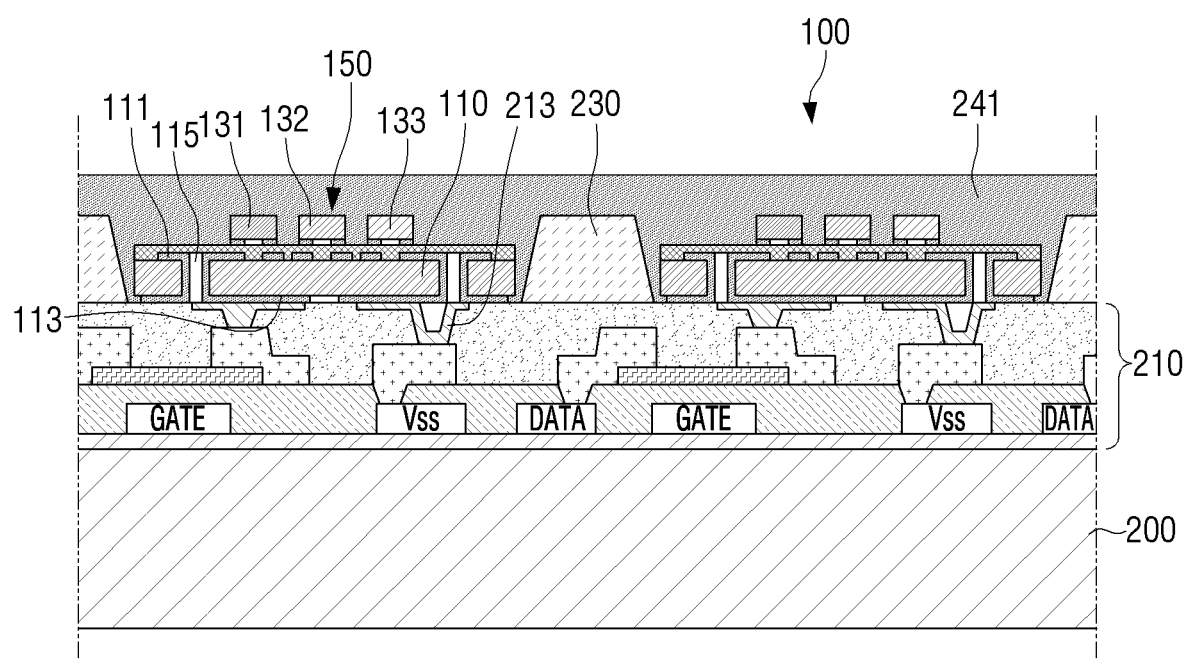
FIG. 10B is a diagram illustrating a manufacturing process of forming a molding part according to an embodiment.

Referring to FIG. 10B, after disposing the black matrix 230 in the display module, a molding part 241 may be formed to protect the plurality of LED packages 150 and the black matrix 230 of the display module 100. The molding part 241 may be a transparent resin material. In addition, although not illustrated in the drawings, a touch screen may be stacked on the molding part 241.

After forming the black matrix 230 in the display module 100, a protection layer 240 covering both the plurality of LED packages 150 and the black matrix 230 may be formed (as shown in FIG. 1) on top of the above-described molding part 241 to protect the plurality of LED packages and the black matrix. In this case, after forming the molding part 241 to cover both the plurality of LED packages 150 and the black matrix 230, the protection layer 240 or the touch screen may be stacked on the molding part 241.

In the pick and place transfer process or the stamping transfer process applied as the transfer of the LED package, the picker after picking the plurality of LED packages from the transfer substrate may move the plurality of LED packages toward the target substrate side to place the plurality of LED packages to a predetermined position of the target substrate.

The LED package transfer process according to another embodiment may be carried out through a laser transfer process.

In the case of the laser transfer process, unlike the pick and place transfer process or the stamping transfer process, a picker is not used and transfer is carried out using a laser beam. Further, in the laser transfer process, one surface of the transfer substrate with the plurality of LED packages disposed may be disposed to face the one surface of the target substrate to which the plurality of LED packages may be transferred, and the transfer substrate may be positioned between the laser oscillator irradiating a laser beam and the target substrate.

In order to manufacture a transfer substrate appropriate for the laser transfer process, a few processes may be added to the manufacturing process of the transfer substrate applicable to the pick and place transfer process or the stamping transfer process, and the embodiment will be described in detail herein below.

FIGS. 11 to 14 are diagrams illustrating sequentially a manufacturing process of a display module including an LED package according to an embodiment.

Figure 11:
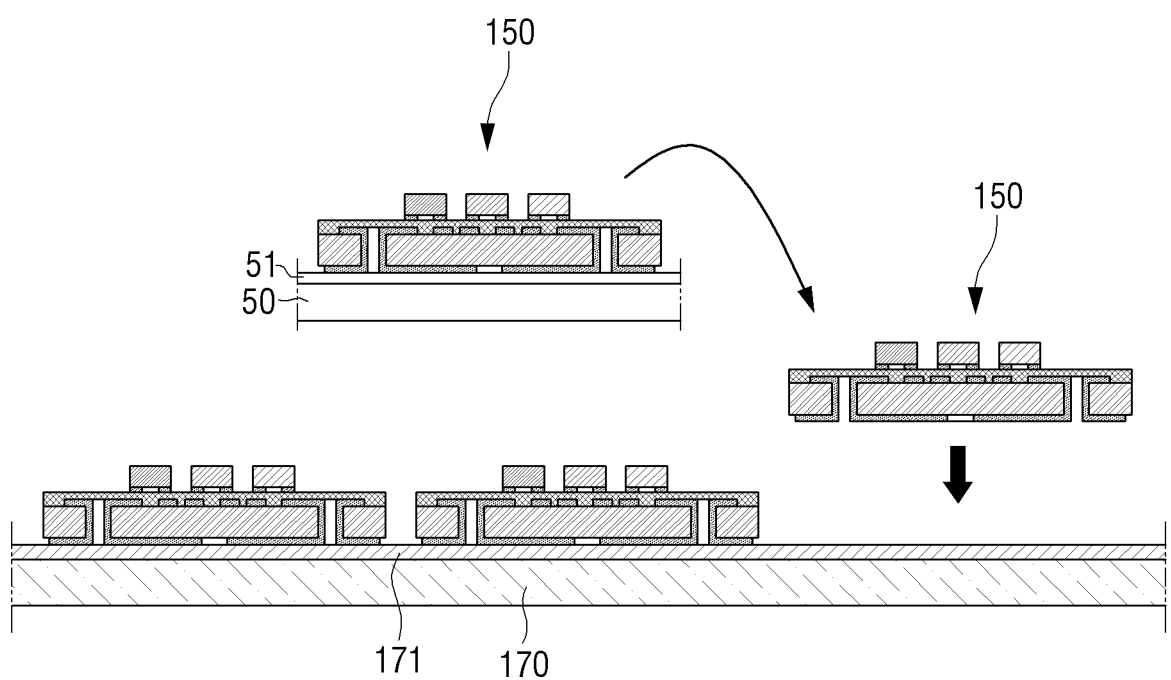
FIGS. 11 to 14 are diagrams illustrating sequentially a manufacturing process of a display module including an LED package according to an embodiment.

In FIG. 11, the plurality of LED packages 150 disposed on the carrier substrate 50 may be transferred to an additional carrier substrate 170 to have an overall uniform brightness based on the above-described shuffle data. In this case, the plurality of LED packages 150 may be formed by attaching the opposite surface of the connection substrate to which micro LEDs have not been disposed to an additional carrier substrate 170.

The additional carrier substrate 170 may be formed of a transparent material for the plurality of LED packages 150 to be conveyed to a transfer substrate 180 by a laser beam.

Figure 12:
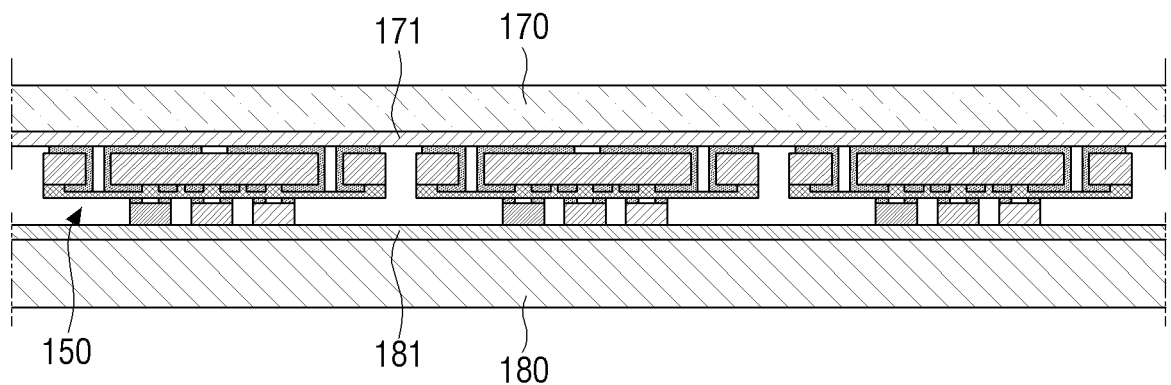

Referring to FIG. 12, in order to convey the plurality of LED packages of the additional carrier substrate 170 to the transfer substrate 180, the additional carrier substrate 170 and the transfer substrate 180 may be disposed to face each other. In this case, the plurality of LEDs provided in the plurality of LED packages of the additional carrier substrate 170 may be placed in close contact to the one surface of the transfer substrate 180.

In the state described above, when irradiating a laser beam to the opposite surface (i.e., the surface where the LED package is not disposed) of the additional carrier substrate 170, the plurality of LED packages 150 may separate from an adhesive layer 171 of the additional carrier substrate 170 due to the heat of the laser beam and may attach to an adhesive layer 181 of the transfer substrate 180.

The plurality of LED packages 150 transferred to the additional carrier substrate 170 may be in a state in which the plurality of micro LEDs are in contact with the adhesive layer 181 of the transfer substrate 180.

The adhesive layer 171 of the additional carrier substrate 170 and the adhesive layer 181 of the transfer substrate 180 may be pressure sensitive adhesives (PSA).

The transfer substrate 180 may be formed of a transparent material to convey the plurality of LED packages 150 to the target substrate 200 by a laser beam.

Figure 13:
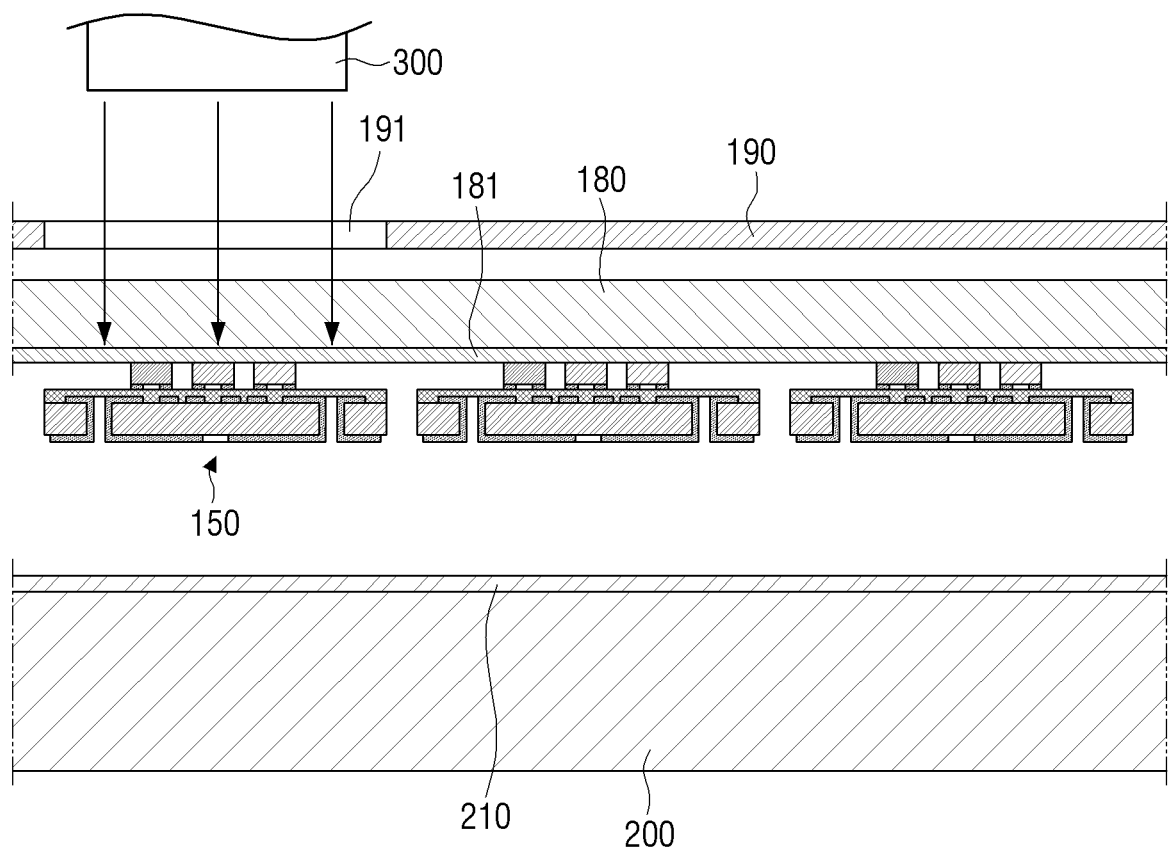

Referring to FIG. 13, in order to convey the plurality of LED packages 150 on the transfer substrate 180 to the target substrate 200, the transfer substrate 180 may be configured to face the target substrate 200. In this case, the transfer substrate 180 may be configured such that the plurality of LED packages 150 face the surface to be transferred on the target substrate 200.

A mask 190 may be disposed on the opposite surface (i.e., the surface where the LED package is not disposed) of the transfer substrate 180.

The mask 190 may limit an irradiation area of the laser beam irradiated toward the transfer substrate 180 from the laser oscillator 300. Here, the mask 190 may be provided with a plurality of openings 191 for laser beam to pass therethrough.

The transfer substrate 180 and the target substrate 200 may be set to the transfer position by a separate stage in an X-Y plane movement, respectively.

When the laser beam is irradiated toward the transfer substrate 180, the laser beam that passed the opening 191 of the mask 190 may then transmit to the transfer substrate 180 and heat the adhesive layer 181.

Figure 14:
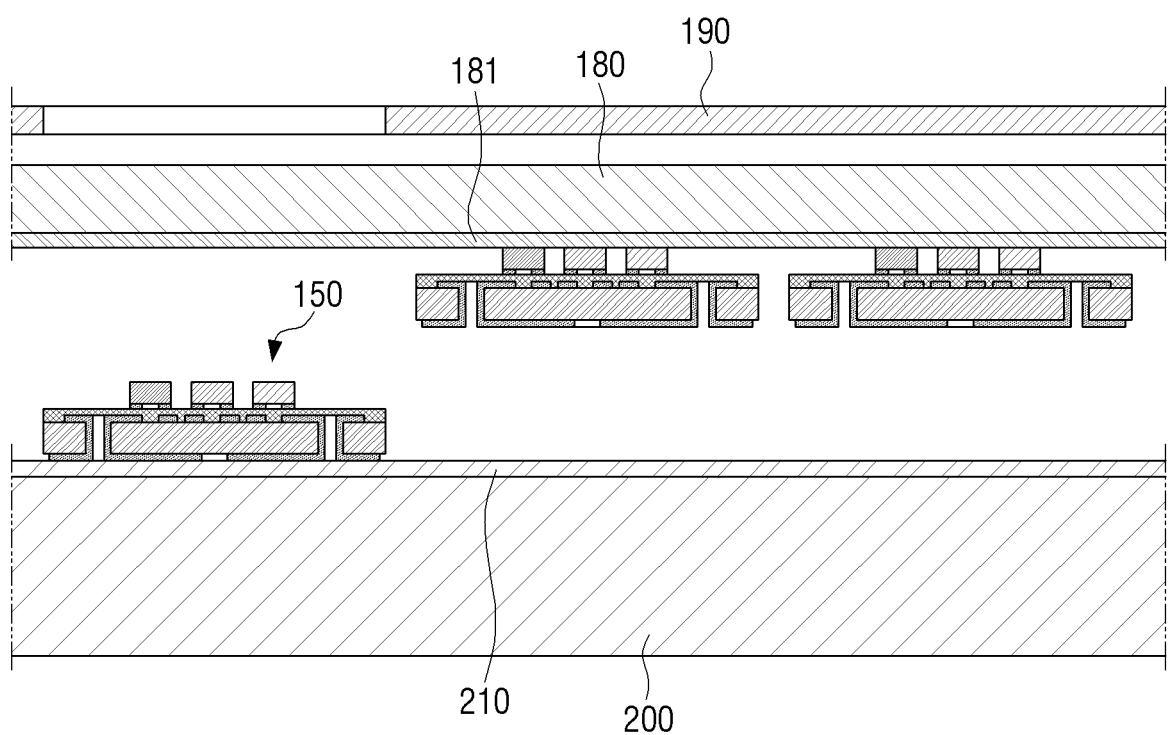

Referring to FIG. 14, the LED package 150 positioned at an area irradiated by the laser beam in the transfer substrate 180 may be separated from the adhesive layer 181 of the transfer substrate 180 and transferred to the TFT layer 210. In addition, if the laser beam is irradiated using a line scan method, the plurality of LED packages may be transferred to the TFT layer 210 substantially at the same time (i.e., consecutively at a very short time interval).

The LED package 150 transferred to the TFT layer 210 may be electrically coupled with each of the electro pads provided on the TFT layer 210 which is disposed on the opposite surface of the connection substrate.

While the embodiments of the disclosure have been illustrated and described with various example embodiments thereof, the disclosure is not limited to the specific embodiments described herein. It will be understood by those skilled in the art that various changes in form and details may be made therein without departing from the spirit and scope of the disclosure.

What is claimed is:

1. A display module, comprising:
   a substrate;
   a thin film transistor (TFT) layer disposed on a surface of the substrate;
   a plurality of LED packages comprising a connection substrate and a plurality of LEDs disposed on a first surface of the connection substrate;
   a wiring configured to electrically connect the TFT layer and the plurality of LEDs;
   a molding part configured to cover the plurality of LED packages and the substrate; and
   a black matrix disposed between each of the plurality of LED packages on the TFT layer,
   wherein the wiring comprises a first wiring for electrically coupling with the plurality of LEDs on the first surface of the connection substrate, and a second wiring for electrically coupling with the TFT layer on a second surface of the connection substrate,
   wherein the molding part covers the TFT layer exposed between the plurality of LED packages, and
   wherein spaces provided between each of the plurality of LED packages and the black matrix are filled with the molding part.

2. The display module of claim 1, wherein an electrode of each of the plurality of LEDs is electrically coupled with the first wiring through a first electrode pad formed on the first surface of the connection substrate, and
   wherein an electrode on the TFT layer is electrically coupled with the second wiring through a second electrode pad formed on the second surface of the connection substrate.

3. The display module of claim 2, wherein each of the plurality of LED packages is electrically coupled to a common electrode or individual electrodes formed on the TFT layer.

4. The display module of claim 1, wherein the first wiring and the second wiring are electrically coupled to each other through at least one via hole.

5. The display module of claim 1, wherein the connection substrate further comprises at least one wiring layer.

6. The display module of claim 1, wherein each of the plurality of LED packages constitutes at least one display pixel.

7. The display module according to claim 1, wherein the plurality of LEDs are micro LEDs.

* * * * *